(12) United States Patent
Lublin et al.

(10) Patent No.: US 6,563,128 B2
(45) Date of Patent: May 13, 2003

(54) BASE STABILIZATION SYSTEM

(75) Inventors: Leonard Lublin, Concord, MA (US); David J. Warkentin, Boston, MA (US); Baruch Pletner, Newton, MA (US); John A. Rule, Hingham, MA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 10/074,059

(22) Filed: Feb. 11, 2002

(65) Prior Publication Data

US 2003/0047693 A1 Mar. 13, 2003

Related U.S. Application Data

(63) Continuation-in-part of application No. 09/803,320, filed on Mar. 9, 2001.
(60) Provisional application No. 60/338,592, filed on Nov. 30, 2001.

(51) Int. Cl.[7] .............................................. G01N 21/86
(52) U.S. Cl. ......................... 250/548; 355/53; 248/550
(58) Field of Search ................. 250/548; 356/399–401; 355/53, 55; 248/550

(56) References Cited

U.S. PATENT DOCUMENTS 5,170,104 A * 12/1992 Laughlin ..................... 315/135
6,213,443 B1 * 4/2001 Wakui ......................... 248/550

* cited by examiner

*Primary Examiner*—Stephone Allen
(74) *Attorney, Agent, or Firm*—John R. Ross

(57) ABSTRACT

A system that provides a base stabilization system for controlling motion of a controlled structure. The system includes a ground structure such as the floor of a fabrication facility and the controlled structure includes a base on which equipment is mounted. The system also includes at least three air mounts and a plurality of actuators all attached to the ground structure and to the base to isolate the base from the ground structure and to stabilize the base. The system includes a plurality of position and acceleration sensors each of which are co-located with a corresponding actuator. The system also includes a multi-input, multi output feedback control system comprising a computer processor programmed with a feedback control algorithm for controlling each of the actuators based on feedback signals from each of the sensors. The co-location of the sensors with the actuators avoids serious problems resulting from higher order vibration modes.

14 Claims, 13 Drawing Sheets

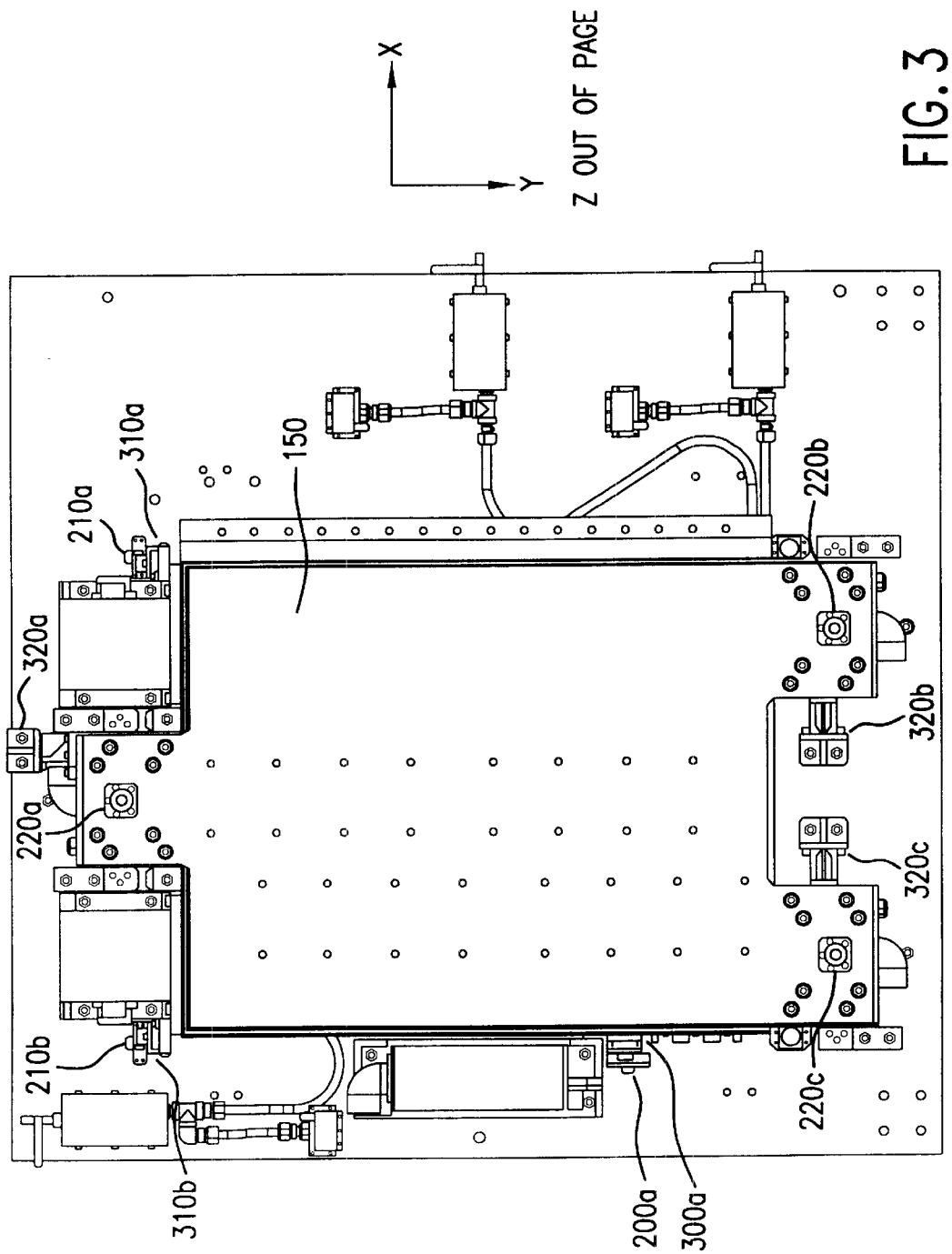

BASE STABILIZATION SYSTEM

This application is a continuation-in-part of U.S. Application Ser. No. 09/803,320 filed on Mar. 9, 2001, and is entitled to the benefit of Provisional Application Ser. No. 60/338,592 filed on Nov. 30, 2001, the disclosures of which is hereby incorporated by reference. The invention relates generally to devices for, and methods of, precisely and optimally controlling the motion of a structure, such as a lithography stage.

BACKGROUND OF THE INVENTION

The ability to accurately control motion of a structure in three-dimensional space, or to control motion of one structure relative to another structure in a given space, poses a problem of significant technological and economic consequence to many manufacturing applications, such as those used to fabricate semiconductor chips, printed circuit boards, liquid crystal displays, and thin film devices. Such operations often employ specialized structures, such as lithography stages, laser light sources, metrology stages, pick-and place-equipment, wafer-handling robots, gantry/head assemblies, linear motors, photoimaging systems, and etching systems, to manufacture and inspect these often-delicate and sensitive products.

Indeed, semiconductor chip manufacture can be so sensitive, that tiny ranges of unwanted motion, for example, in the micrometer ($\mu$m) to nanometer (nm) range, can interfere with components or subsystems that require precise alignment and positioning. The need for such near-exacting precision in chip manufacturing is illustrated, for instance, in the careful matching of a wafer mask to a silicon substrate. Because small variances in mask placement may escape detection until the quality control inspection, until installation in end-products, the need for identifying and quickly correcting the effect of positioning and disturbance-related errors in the first place is of utmost importance.

These structures may be required to move very quickly to specific points in space, whether to an absolute coordinate or to a point defined in relation to another point, such as another structure. A wafer stage is a moveable structure in a lithography machine which carries wafers and positions them for illumination. A stage carrying a wafer must move to precisely aligned points with respect to an optical lens so that an image may be created on the wafer using photolithographic processes. The image is then further processed to create the fine circuitry within semiconductor devices. These processes are generally repeated multiple times creating layers of the fine circuitry. Alignment of these layers can be critical to the performance of the devices. Alignment errors of several nm can sometimes be sufficient to render a device useless or severely limit its performance. Because structures such as these typically operate within specifically calibrated, relatively fault-intolerant operational ranges of movement, and because the movements themselves must be precisely and efficiently timed and executed, methods and devices which allow for precise and optimized control would present a welcome opportunity to improve such manufacturing and inspection processes.

As chip-making technology has advanced, for example, through the use of advanced photolithography lasers such as those sold by Cymer, Inc. of San Diego, Calif., chip throughput requirements have also increased. One consequence of the increased requirements has been a faster positioning of the stages on which the reticules and wafers ride. With faster positioning has come dramatic increases in the attendant motion control issues. For example, among other effects upon manufacturing, faster positioning has created a need to predict and control flexible deformation modes of stages. This, coupled with the relatively low level of structural damping of typical stages (arising from the requirement that the stages be both light and stiff), creates a host of scenarios where stages must be carefully controlled to achieve sustained, near-optimal operational behavior.

Active vibration and motion control provides one promising method of achieving adequate system governance. However, unknowns in plant dynamics and unforeseen disturbances to systems being controlled can significantly alter the actual results attained through active structural control, especially when used with sensitive machines such as semiconductor capital equipment. In this context, disturbances can manifest themselves in a variety of ways, such as affecting the signals input to the system being controlled, causing variances in sensor signals or by impacting performance variables. In addition, uncertainty in base or stage dynamics, and the impact upon those dynamics caused by changes in equipment configuration, mass distribution, and aging of equipment, subsystems, or components, all may serve to limit the performance of any standard control method chosen.

In order to achieve required precision lithography stages are supported by base structures that are actively isolated from floor vibrations. Active isolation control in its simplest form requires that these bases be extremely heavy with respect to the stages, and that they have no structural elastic behavior in the active isolation control band. These requirements lead to such bases often weighing several metric tons, and being constructed of difficult to use materials such as granite. This significantly increases the cost of these bases, as well as associated costs such as handling, transportation, etc. It also requires that actuators used in the system have much higher force ratings, and therefore also be expensive and difficult to handle, as well as requiring large space for amplifiers and other components. Prior art active isolation control systems typically use a simple low order single input single output (SISO) control algorithms.

SISO control algorithms impose these severe limitations on base structures for a number of reasons including:

1. Control of multiple axes with SISO controllers requires efficient and robust decoupling of the motion along the different axes (plunge, pitch, roll, etc.). Such decoupling cannot be achieved when center of gravity and rotary inertias change as a function of time as they would if the mass ratio of moving stage to base was not low in the extreme.
2. Even in the absence of any moving mass, axes of motion decoupling is only possible when the base behaves as one rigid body (below the first resonant frequency). If the base has elastic vibrations in the isolation control band, no decoupled SISO control is possible.
3. Low-order controllers cannot address lightly damped structural vibrations because they have limited gain roll-off values (typically 20 dB per decade), and therefore the presence of such vibrations at or even near the desired control band will severely limit performance of such low-order controllers.

Thus the active isolation system is limited in its performance and requires extremely cumbersome mechanical design. Additionally, the low-order SISO controllers in current practice must be tuned by highly trained, technical personnel.

The shortcomings of active control are especially appreciated when taken from a thoroughly predictable laboratory setting to the rigors of the factory floor. In laboratory tests, one can completely characterize the system being controlled, including experimentally induced disturbances, before closing the loops and then adjust the control gains to get the best possible response out of the system. In this manner, it is possible to eliminate nearly all of the uncertainty about a system's input/output behavior in a specified frequency range, especially when using modern system identification techniques. In real world applications, however, it is often impossible to recreate system performance identical to that observed in the lab. Part-to-part variation results in significant differences in response to control inputs, even between nominally identical systems, and even when using the same controller. Changes in environment and equipment configuration can cause even more insidious (and difficult to pinpoint) modeling errors because they can vary from location to location and may also vary with time. These issues invariably arise in the case of semiconductor fabrication equipment, where the dynamics of the individual system cannot be completely known until it has been deployed and used in the factory. Furthermore, the exact character of a disturbance in physical conditions, let alone specific disturbance frequencies, are rarely known ahead of time with the precision needed to optimize performance and, unfortunately, can be time-varying themselves.

Researchers have been addressing these issues outside of the semiconductor industry by applying adaptive control techniques to the structural control problem. The thrust of these efforts has been to make the adaptive control algorithms as general as possible, with the goal of making a controller which uses an unchanging theoretical model to work for all conceivable systems under all conditions. Such a control algorithm necessarily (and undesirably) complex and, for most practical applications limits the performance of the controller.

Some research in the area of adaptive control (see Åström, K. J; Wittenmark, B.; Adaptive Control, Addison-Wesley Publishing Company, 1995, and Narendra, K. S.; Annaswamy, A. M.; Stable Adaptive Systems, Prentice-Hall Inc., Englewood Cliffs, N.J., 1989) has focused on its application to flexible structures. Roughly, the favored approaches of these efforts can be divided into three classes of feedback control: direct adaptive control, self tuning regulators, and tonal controllers. The direct adaptive controllers compute control gains "adaptively", i.e., directly from measurement errors. (See Annaswamy, A. M.; Clancy, D. J.; "Adaptive control strategies for flexible space structures", IEEE Transactions on Aerospace and Electronic Systems, v32 n3, July 1996; Bakker, R.; Annaswamy, A. M.; "Low-order multivariable control with application to flexible structures", Automatica v32 n3, March 1996; and Ho, M-T Yang, J. C.; Chew, M.; "New adaptable reference model adaptive control for slewing control of a flexible beam with an unknown tip load", Proceedings of the SPIE Smart Structures and Materials Conference: Smart Structures and Integrated Systems, v2443, February–March 1995.) Tonal controllers are those designed to perform disturbance rejection at one or several discrete frequencies. (See Yen, G. G.; "Active vibration control in precision structures", Proceedings of the SPIE Conference on Artificial Neural Networks III, v3077, April 1997; Boson, M.; Douglas, S. C.; "Narrowband disturbance rejection using adaptive feedback algorithms", Proceedings of the SPIE Smart Structures and Materials Conference: Mathematics and Control in Smart Structures, v 3039, March 1997; and Bodson, M.; Douglas, S. C.; "Rejection of disturbances with a large sinusoidal component of unknown frequency" Proceedings of the SPIE Smart Structures and Materials Conference: Mathematics and Control in Smart Structures, v2715, February 1996.) The disturbance is a sinusoid, usually of unknown frequency. The tonal controller either adapts to changes in frequency, changes in plant dynamics, or both. This type of control can achieve perfect disturbance rejection (as measured by the sensors) in instances where the number of error sensors is less than or equal to the number of actuators and the actuators have sufficient control authority. Self tuning regulators add an extra step to the adaptation process, namely, the adaptive updating of an internal model in the tuning algorithm. This model is used to compute control gains. These methods do not generally require collocation, and are distinguished from each other primarily by the algorithm used to perform identification (ID) of the internal model. Among the ID methods used in these types of controllers are neural nets, (see for example, Davis, L. D.; Hyland, D. C.; "Adaptive neural control for the ASTREX testbed", Proceeding of the American Control Conference, v3, June 1997, modal parameters (see for example, Baz, A.; Hong, J-T.; "Adaptive control of flexible structures using modal positive position feedback", International Journal of Adaptive Control and Signal Processing, v11 n3, May 1997) physical structural properties (e.g. mass and stiffness) (see Gopinathan, M.; Pajunen, G. A.; Neelakanta, P. S.; Arockiasamy, M.; "Linear quadratic distributed self-tuning control of vibration in a cantilever beam", Proceedings of the SPIE Smart Structures and Materials Conference: Smart Structures and Integrated Systems, v2443, February–March 1995) and families of models that span the parameter variation space (see Fitch, J. A.; Maybeck, P. S.; "Multiple model adaptive control of a large flexible space structure with purposeful dither for enhanced identifiability", Proceeding of the 33rd IEEE Conference on Decision and Control, v3, December 1994; and Schiller, G. J.; Maybeck, P. S.; "Control of a large space structure using MMAE/MMAC techniques", IEEE Transaction s on Aerospace Electronic Systems, v33 n4, October 1997).

What is needed is a better base stabilization system.

SUMMARY OF THE INVENTION

The present invention provides a base stabilization system for controlling motion of a controlled structure. The system includes a ground structure such as the floor of a fabrication facility and the controlled structure includes a base on which equipment is mounted. The system also includes at least three air mounts and a plurality of actuators all attached to the ground structure and to the base to isolate the base from the ground structure and to stabilize the base.

The system includes a plurality of position and acceleration sensors each of which are co-located with a corresponding actuator. The system also includes a multi-input, multi output feedback control system comprising a computer processor programmed with a feedback control algorithm for controlling each of the actuators based on feedback signals from each of the sensors. The co-location of the sensors with the actuators avoids serious problems resulting from higher order vibration modes.

In a preferred embodiment the base stabilization system is applied to an integrated circuit lithography scanner machine. The air mounts support a base of the scanner machine. Actuators are provided at each air mount to control motion in the vertical z direction. Two additional actuators are provided to control horizontal motion in a y direction and one actuator controls motion in an x direction.

Position and acceleration sensors are co-located with each actuator and based on signals form the sensors the base and the scanner machine supported by it are stabilized by actuators which are controlled by a control system which includes a computer processor programmed with a feedback control algorithm developed using a linear quadratic regulator approach.

BRIEF DESCRIPTION OF THE DRAWINGS

FIG. 3 depicts various collocated sensors used on an isolation system.

DETAILED DESCRIPTION

Figure 1:
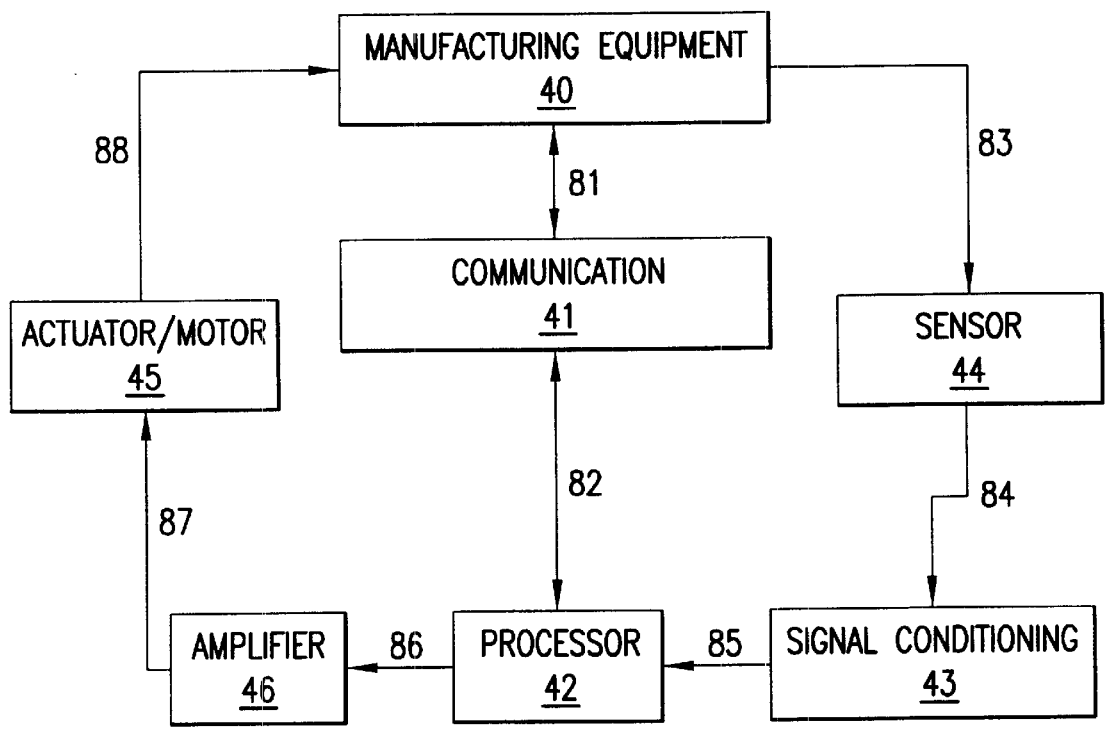
FIG. 1 is a schematic illustration of a control system implemented on a piece of manufacturing equipment.

Importance of Collocation of Sensors and Actuators

Motion control systems can be conceptualized in terms of relative position of one or more locations on a structure relative to one or more locations on the ground. For example, the position of a single location on a structure (x1, y1, z1) relative to a single location on the ground (x2, y2, z2). Additionally, one might also specify the velocity and/or acceleration of a location. Additionally, one might specify the position, velocity, and/or acceleration at each of these points and at intermediate points or per a defined function in between. Preferred embodiments of the present invention employ a controller generated using a Linear Quadratic Gaussian (LQG) problem formulation, though other well-known control synthesis and optimization methods, such as H-infinity or $\mu$-synthesis, could also be used. These optimization methods are described in *The Control Handbook*, William S. Levine, Editor, CRC Press, 1996. The controller may, optionally, be self-tuning using techniques described in this reference to ensure accuracy and optimization of the isolation performance desired over time.

As described in the background section, stabilization and isolation controllers for microlithography scanners are not new. Current scanners employ active isolation to reject undesirable motions introduced by moving stages and floor vibrations. Important improvements presented here relate to the number, selection, and placement of sensors used for active isolation and stabilization controllers in microlithography scanners. Existing isolation controllers for microlithography scanners presume that the bodies being isolated are rigid. That is that there is no significant structural flexibility. As performance tolerances get tighter and throughput demands increase so increase the required control bands for the isolation and stabilization controllers. These control bands incorporate a multiplicity of elastic vibration modes of the structures being stabilized. Thus, the assumption that the bodies being isolated are rigid no longer applies. Structural flexibility is taken into consideration when implementing broadband stabilization and isolation controllers in microlithography scanners.

A key concept presented here is to ensure sensors are collocated with the actuators when designing active isolation systems for microlithography scanners. That is to locate the sensors at the same physical point as the actuators, or as close as possible to the actuators. Preferably, the type of the sensors selected is such that the product of the physical property measured by the sensors and the physical property delivered by their collocated actuators defines true mechanical work. For example, sensors measuring displacement or stroke are best collocated with actuators delivering force, since the product of force and stroke is true mechanical work.

It is known that control performance can be made more complicated when sensors are not collocated with actuators in systems with structural flexibility. See, Cannon, R. H. and Rosenthal, D. F., "Experiments in Control of Flexible Structures with Non-Collocates Sensors and Actuators," Journal of Guidance Control and Dynamics, Vol. 7, No. 5, September–October, 1984, pp.546–553. There is also theoretical evidence that non-collocated sensors and actuators limit performance. The theoretical evidence arises from two sources. First, non-collocated sensors and actuators introduce right half plane zeros (also known as non-minimum phase zeros) into the control loop. For a description of this issue, see Fleming, Farla M., "The Effect of Structure, Actuator, and Sensor on the Zeros of Controlled Structures," Masters Thesis, Dept. of Aeronautics and Astronautics, Massachusetts Institute of Technology, 1990; and Spector, Va., and Flashner, H., "Modeling of Non-Collocated Structural Control Systems," AIAA Guidance Navigation and Control Conference, 1988, Paper No. 88–4060.Second, non-minimum phase zeros in the control loop introduce significant performance limitations. This is the case for both disturbance rejection and command following. (See Freudenberg, J. and Looze, D., "Right Half Plane Poles and Zeros and Design Tradeoffs in Feedback Systems," IEEE Transactions on Automatic Control, Vol. AC-30, No. 6, January 1985.) Also see discussion of this subject in The Control Handbook. These right half plane zeros appear in the finite state mathematical description of a mechanical system in which the response of a sensor at one point to an actuator at another point is delayed due to the finite propagation speed of disturbances in the system (e.g., stress and strain changes in a metal structure propagate at the speed of sound in that material). In a closed-loop control system, the time delay associated with such zeros presents a fundamental limit to the ability of the control system to specify the motion of equipment such as a lithography scanner. These limitations will manifest themselves in restricting the control band to frequencies below the first non-minimum phase zero, and in requiring lower gains in the resulting reduced control band.

To avoid the occurrence of right half plane zeros that limit performance, we propose to ensure that the sensors and actuators employed in stabilization and isolation systems in microlithography scanners are collocated.

Multi Variable Control

Another feature that is also the subject of this invention is the application of higher-order, multivariable control to the active isolation of equipment bases such as bases for semiconductor equipment. This control is implemented using hardware and software capable of executing fully coupled multivariable control of at least two axes of motion including all necessary I/O and host communications functions.

FIG. 1 illustrates one embodiment of a feedback control system that could be used on a piece of manufacturing equipment. In this embodiment, the manufacturing equipment 40 sends a signal 81 to a communication module 41. The module 41 then sends the signal to the processor 42. The processor 42 then sends a signal to amplifier 46 that then sends a signal 87 to the actuator/motor 45. Actuator/motor 45 then acts on the manufacturing equipment 40. By way of example, manufacturing equipment 40 could be the base isolation system depicted in FIGS. 2, 2A, and 3. A sensor 44 then measures the behavior of the manufacturing equipment 40 due to the effect the actuator/motor has upon the manufacturing equipment 40. The sensor 44 then sends a signal to signal conditioning unit 43. Signal conditioning unit 43 then sends signal 85 to the processor. Processor 42 might be Model micro-line® C6711 CPU supplied by Orsys Orth System GMBH with offices in Markdorf, Germany. This processor is a high performance digital signal processor single board computer featuring analog input and output capability. An additional circuit board would be used in conjunction with the computer to provide analog and digital input and output capability.

Base Stabilization

Figure 2:
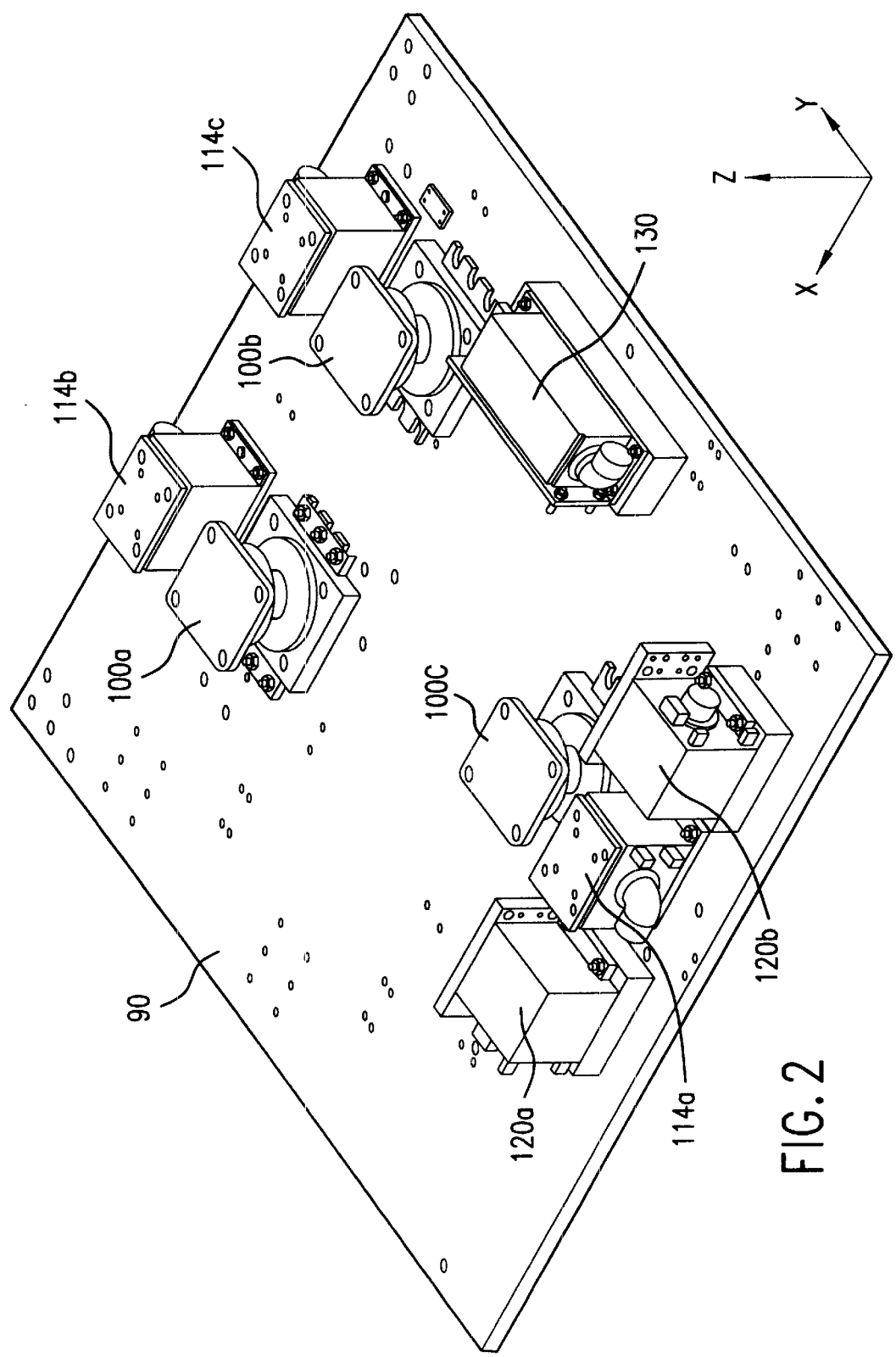
FIGS. 2 and 2A depict various components of an isolation system with respect to the floor.
Figure 2A:
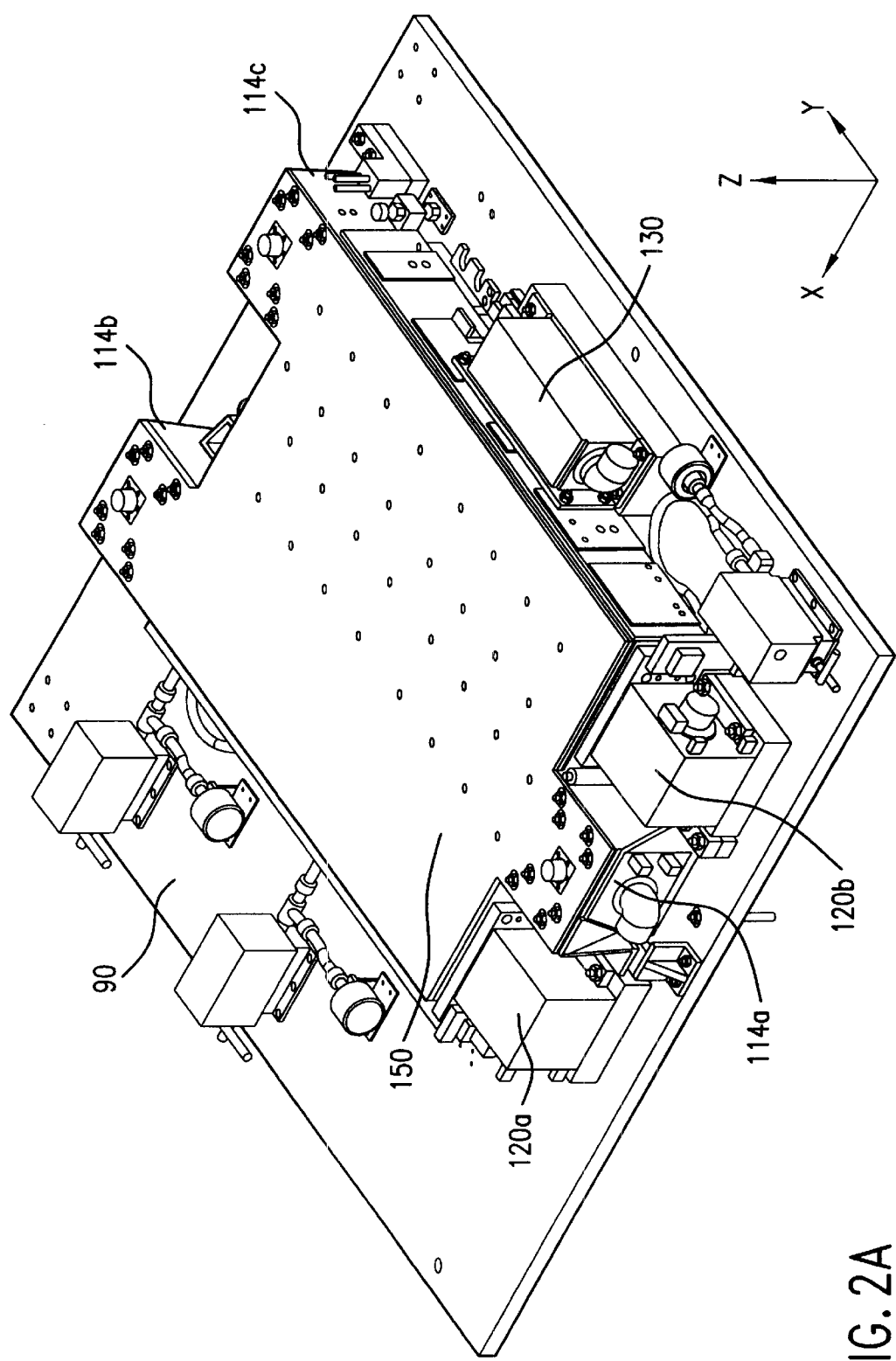

FIGS. 2 and 2A illustrate a portion of a system for stabilizing the base of a lithography tool. In this illustration, ground structure 90 constructed of aluminum is representative of the floor of a semiconductor fabrication facility. A series of actuators and air mounts are attached to a base 150 to isolate the base in three axes (X, Y, Z) from the vibratory disturbances (typically ground vibrations) of the surrounding environment. By way of example, additional system components which would be attached to base 150 are not shown. Additional components would include additional voice coil motors and moving stages used to control the position and motion of the silicon wafer.

In this specific embodiment, air mounts 100 a, b, c bolted to the ground structure 90 offload the weight of the lithography tool due to gravity and provide passive isolation. A representative air mount which provides a max load of 300 kg, a vertical stroke of ±6 mm, a horizontal stroke of ±3 mm with a frequency response of −3db, −90 degrees at 1.5 Hz is manufactured by Kinetic Systems Inc. in Boston, Mass. Voice coil motors are also employed in this example to further isolate the lithography tool from external vibrations. Z-axis voice coil motors 114 a, b, and c are attached to ground structure 90 to actively isolate the lithography tool from the external vibrations. A representative z-axis voice coil motor is model LA30-43-000, manufactured by BEI Kimco Magnetics Division in San Marcos, Calif. This motor provides a peak force of 444 N and a stroke of 12.7 mm. Y-axis voice coil motors 120a and 120b and X-axis voice coil motor 130 are attached to ground structure 90 to actively isolate the lithography tool from the external vibrations.

FIG. 3 illustrates the layout of acceleration sensors for measuring the acceleration of the base 150 that moves relative to the ground structure 90. A representative acceleration sensor is model 731A, manufactured by Wilcoxon Research in Gaithersburg, Md. This sensor measures acceleration up to 0.5 g peak. Acceleration sensors 220a, b, and c measure the z-axis acceleration at three locations on the base 150. These three sensors are collocated with z-axis voice coil motors 114 a, b, and c, respectively. Acceleration sensors 210 a and b measure the y-axis acceleration at two locations on the base. 150. These sensors are collocated with y-axis voice coil motors 120 a and b, respectively. Acceleration sensor 200a measures the x-axis Acceleration at one location on the base 150. This sensor is collocated with x-axis voice coil motor 130.

FIG. 3 also illustrates the layout of capacitive gap sensors for measuring the relative distance between points on two structures that move relative to each other. A representative gap sensor is model C8-G, manufactured by Lion Precision in St. Paul, Minn. This sensor measures a displacement range of 1.0 mm–2.0 mm with a resolution of 60 nm. Gap sensors 320 a, b, and c measure the z-axis displacement at three locations on the base 150 relative to the ground structure 90. These three sensors are collocated with z-axis voice coil motors 114 a, b, and c, respectively. Gap sensors 310 a and b measure the y-axis displacement at two locations on the base 150 relative to the ground structure 90. These sensors are collocated with y-axis voice coil motors 120 a and b, respectively. Gap sensor 300a measures the x-axis displacement at one location on the base 150 relative to the ground structure 90. This sensor is collocated with x-axis voice coil motor 130.

Multi-Input, Multi Output Feedback Control

Figure 4:
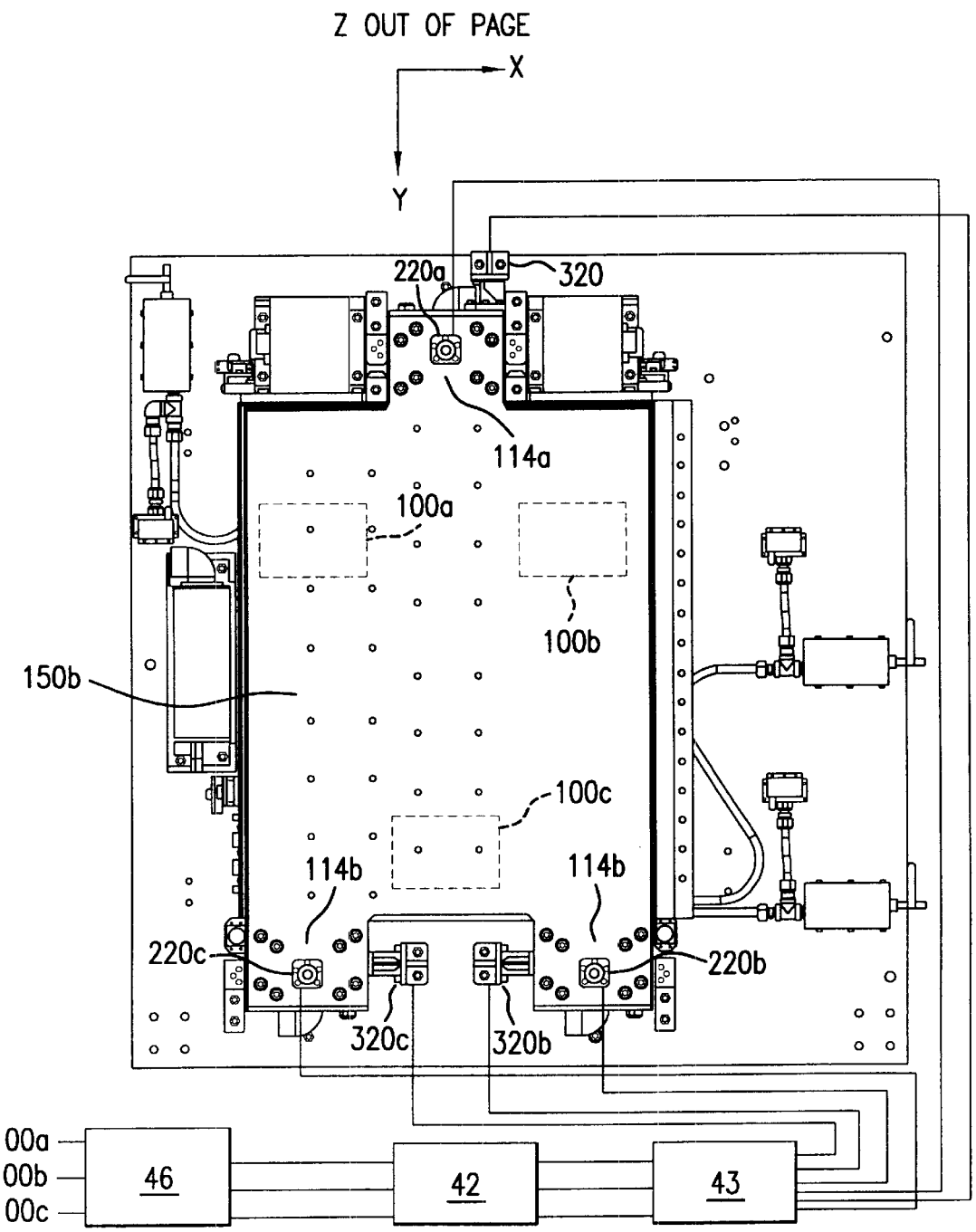
FIG. 4 depicts a base isolation system with an illustration of a control system.

FIG. 4 illustrates a feedback control system used in conjunction with a base isolation system. Electrical signals proportional to displacement measured by gap sensors 320 a, b, and c and accelerometers 220 a, b, and c are sent to signal conditioning module 43. These three signals are then sent to processor 42 which applies a feedback control algorithm to the signals. The control system in the representative embodiment is a multi-input, multi output control system. The feedback control algorithm preferably is designed using a standard linear quadratic regulator approach, ensuring that the motor control signals do not exceed the motor or motor amplifier limits. Control design was accomplished by Applicants by first creating a state-space plant model from transfer function data using the Smart ID™ system identification software package commercially available from Active Control Experts, Inc. with offices in Cambridge, Mass. (see commonly-owned U.S. Patent application Ser. No. 09/896,689 which is incorporated herein by reference. The feedback control algorithm was then designed through computer simulation and application of techniques discussed in Fanson and *The Control Handbook*, William S. Levine, Editor, CRC Press, 1996. The signals output from the processor are electrically amplified in amplifier 46. The amplified signals are then sent to Z-axis voice coil motors 100 a, b, and c shown in FIG. 2 and as hidden beneath base 150 in FIG. 4. There are situations where one would only control z-axis motion, however, practically one would use a similar isolation and control system for all axes (i.e. displacement and rotation axes) using the techniques described above. Therefore, in this embodiment signals from gap sensors 310a, 310b and 300a are used by processor 42 to control horizontal position motors 120a, 120b and 130.

Figure 7:
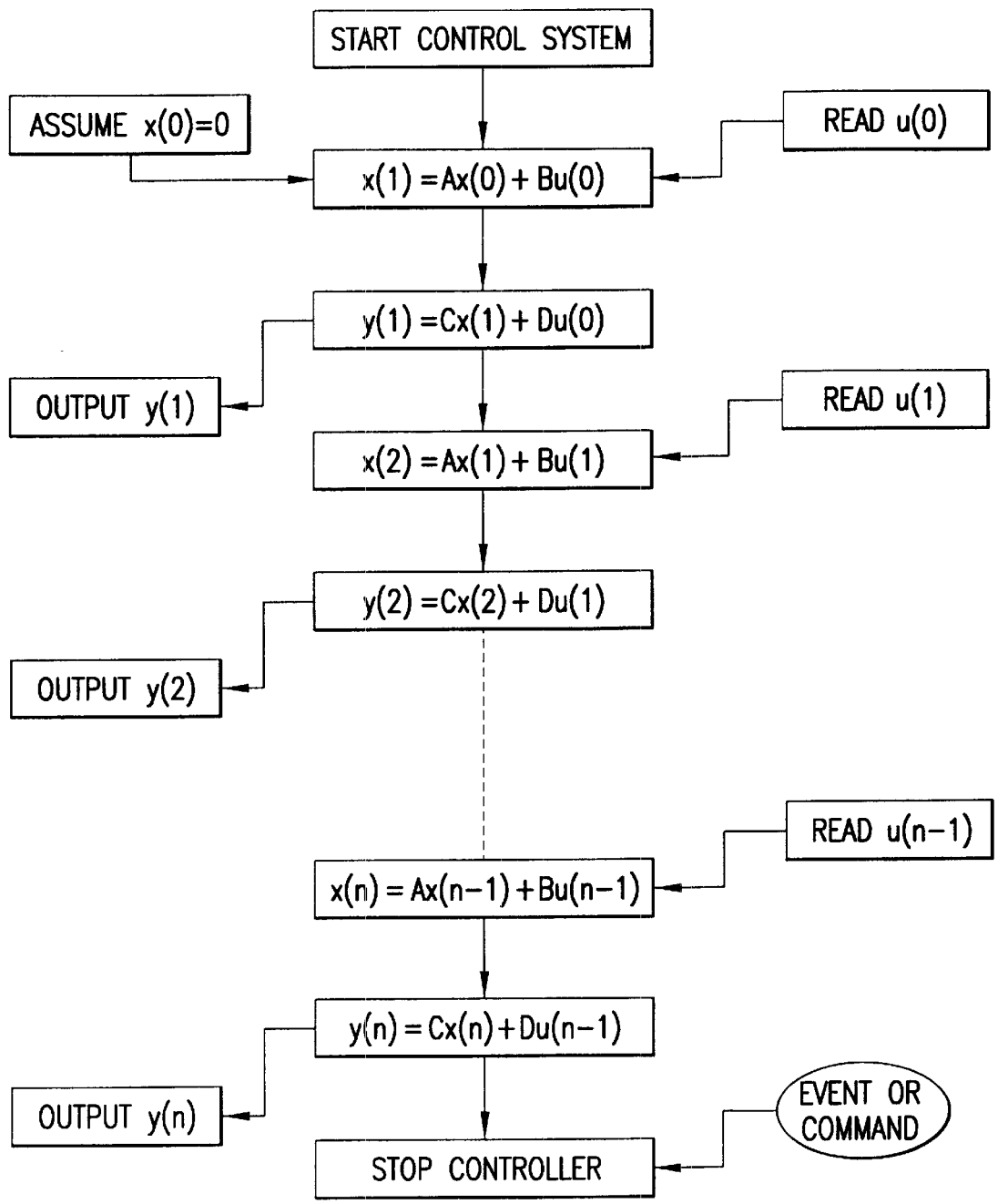
FIG. 7 depicts a flow chart of the calculations performed by the control system in implementing a control algorithm.

The state-space plant model, typically has the following form:

$$x = Ax + Bu$$

$$y = Cx + Du$$

where x represents the states of the plant (in this case the lithography stage process control system), u represents sensor inputs, and y represents actuator outputs. x, x', u, y are vectors of length determined by the number of states, number of input sensors, and number of output actuators. A, B, C, D are matrices that represent the control filter parameters (see commonly-owned U.S. Patent application Ser. No. 09/968,180). FIG. 7 illustrates the calculations performed by the control system in implementing the control algorithm. Preferably, the control system begins calculating based upon a command from the plant and continues until commanded to stop.

High throughput can be achieved by tools with faster motions and lighter parts; but faster motion requires higher control bandwidths, while lighter parts typically imply lower structural vibration frequencies and greater sensitivity to disturbance forces. As the separation between the control bandwidth and the structural frequencies is reduced, the presence of structural modes becomes increasingly significant in the design of control systems that must both ensure the desired motion of the moving parts and at the same time reduce unwanted vibratory motion caused by disturbance forces.

Figure 5:
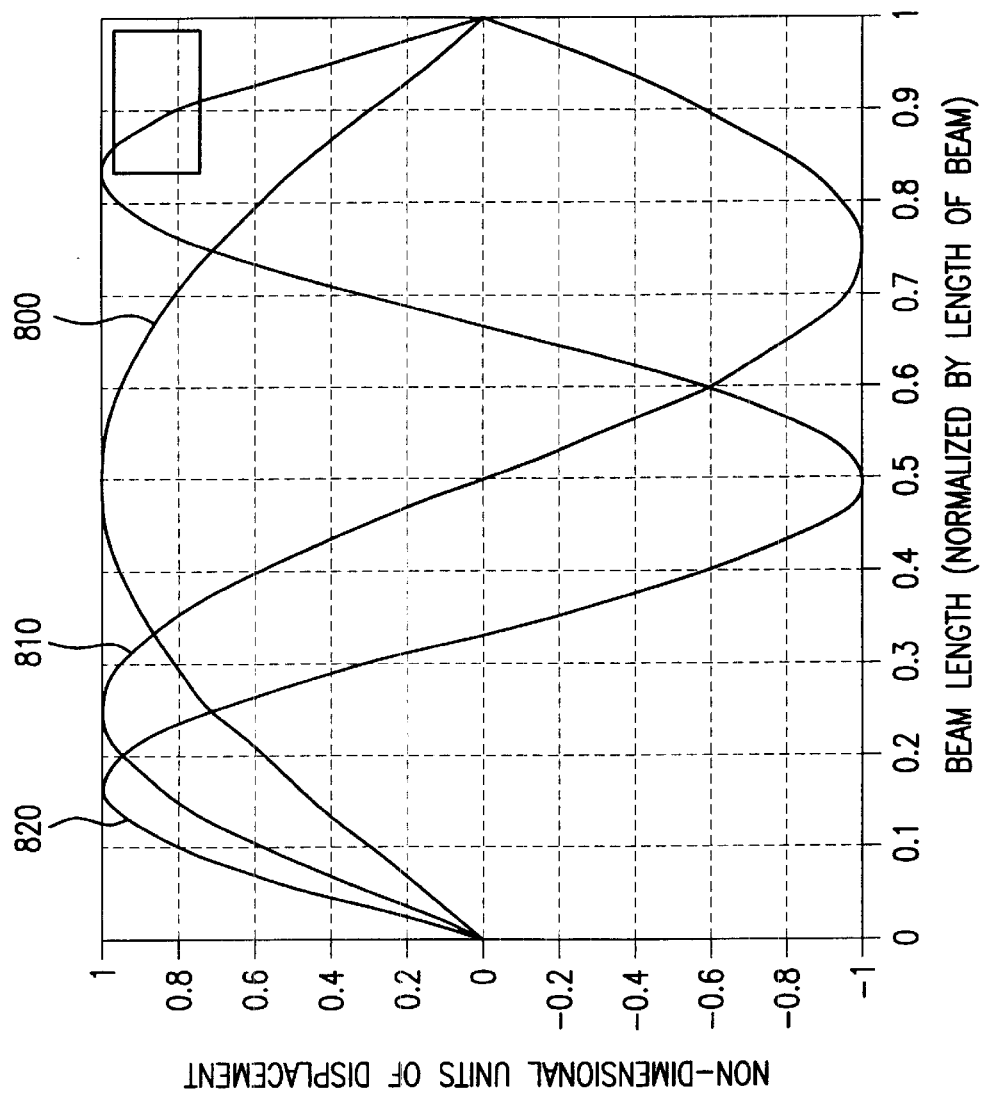
FIG. 5 illustrates the first three mode shapes of a pinned-pinned beam plotted along with example actuator and sensor locations.

The collocation of sensors with actuators has distinct advantages for the design of control systems. One typical consequence of collocation is the alternation of complex poles and zeros in the transfer function measured from actuator to sensor on a structure. This can be illustrated for a system consisting of a beam pinned at both ends with a single point force actuator and two point velocity sensors, one collocated with the actuator and one placed nearby. In this example, the collocated sensor/actuator pair is placed at station 0.3 (with 0.0 and 1.0 being the end points and 0.5 being the midpoint.) The non-collocated sensor is at 0.35; the actuator and sensor locations and the shapes of the first 3 bending modes (first mode 800, second mode 810, third mode 820) are shown in FIG. 5.

Figure 6:
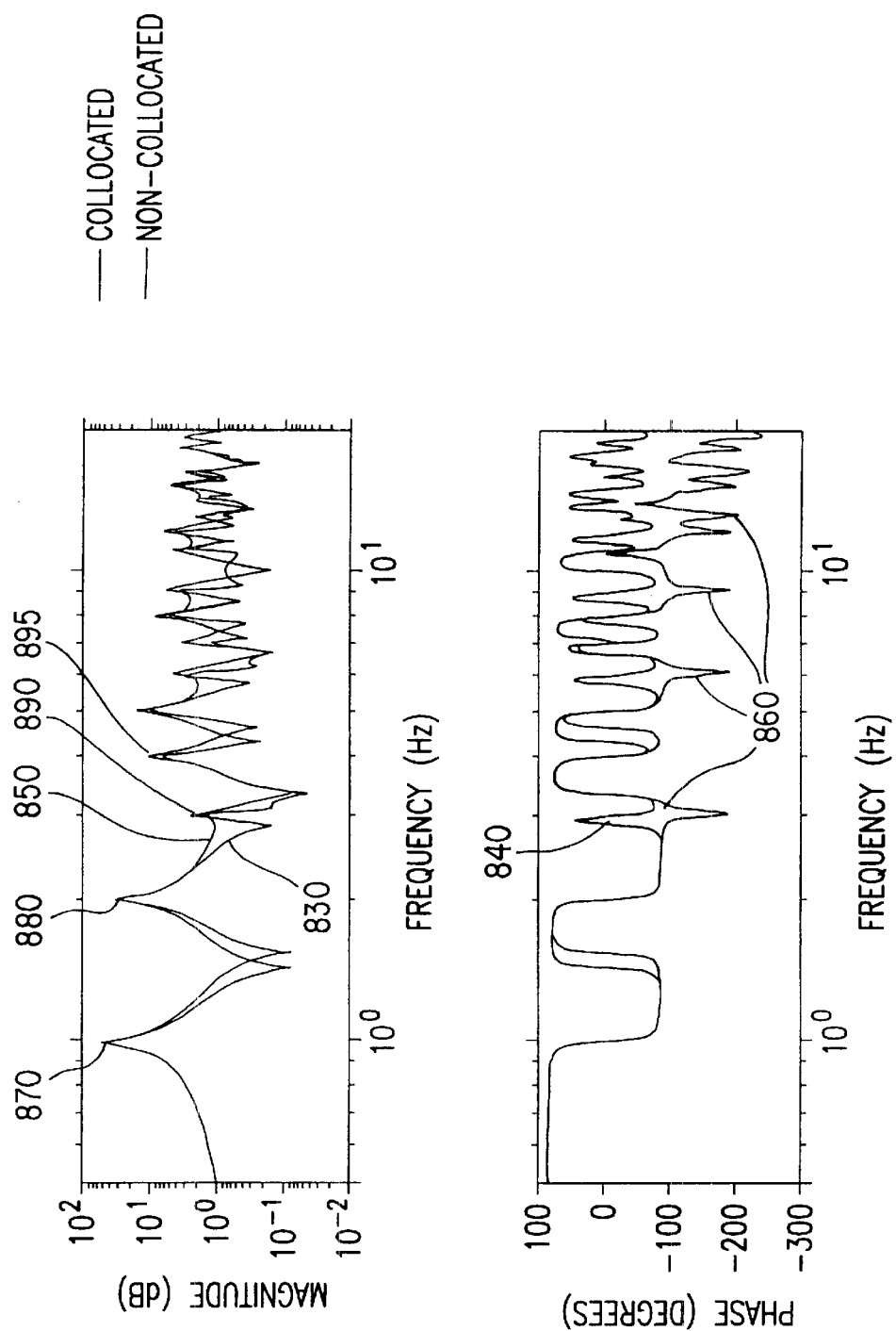
FIG. 6 illustrates the magnitude and phase plots of collocated and non-collocated force to velocity transfer functions for the example beam.

In control systems a transfer function is the mathematical relationship between the output of the control system and its input. For a linear system, it is the Laplace transform of the output developed by the Laplace transform of the input under conditions of zero initial energy state. The contribution of a mode to the transfer function from an actuator to a sensor depends on the modal residue; which is computed from the product of the modal displacements at the actuator and sensor locations. Note that the third mode 820 has a node point between the actuator and the non-collocated sensor as a result of the offset between the two. For the non-collocated pair this will also occur for other, higher modes, but in the case of the collocated pair, this will never be the case. Because a node line never separates the collocated sensor and actuator, their modal residues (obtained from the product of modal displacements at the sensor and actuator locations) will always have the same sign. Since this is not true for the non-collocated pair, the modal residues will have differing signs; in the present case, the modal residue would be positive for the first 800 and second 810 modes, but negative for the third 820. Because of the modal residue sign change in the non-collocated pair, the alternating pole-zero pattern is lost after the second mode 810. Plots of the magnitude and phase of the resulting transfer functions are shown in FIG. 6. Collocated magnitude 830 and phase 840 and non-collocated magnitude 850 and phase 860 are plotted. Each of the modes is also shown in FIG. 6 as a function of the modal frequency; first mode 870, second mode 880, third mode 820, fourth mode 895.

Here we can see that the zero that lies between the second 880 and third 890 mode for the collocated pair is not present for the non-collocated pair; it has moved in between the third 890 and fourth 895 modes. For the collocated pair, the phase transfer function never strays outside the limits of ±90° and −90°, ensuring excellent phase margin for this loop regardless of gain, but the missing zero in the collocated pair causes the phase to drop toward −180° as early as the third mode 890.

As the same problem occurs repeatedly at higher frequencies, we can see that the cumulative effect is to cause the phase to drop in general as a function of frequency, although the overall magnitude does not. This kind of behavior can be recognized as typical of a system that includes a time delay; adopting a wave interpretation of the beam behavior, we can see that a finite amount of time is required for an input at the actuator location to be propagated to the non-collocated sensor location. This delay represents a fundamental limitation on the ability of the controller to reject disturbances acting at the sensor location; even if the disturbance is sensed without delay and the control response computed instantly, time is required for the actuator influence to reach the sensor location. In the meantime, the disturbance has already caused an unwanted deformation of the structure, causing unrecoverable performance degradation. The transfer function from the actuator to the collocated sensor suffers no such loss of phase, it can be shown that, given sufficient control authority and neglecting other non-idealities such as sensor noise and computational delay, there is no fundamental limit to the achievable performance as measured in terms of reduction of undesirable motion at the sensor location.

Separate Sensor Frame

Figure 8:
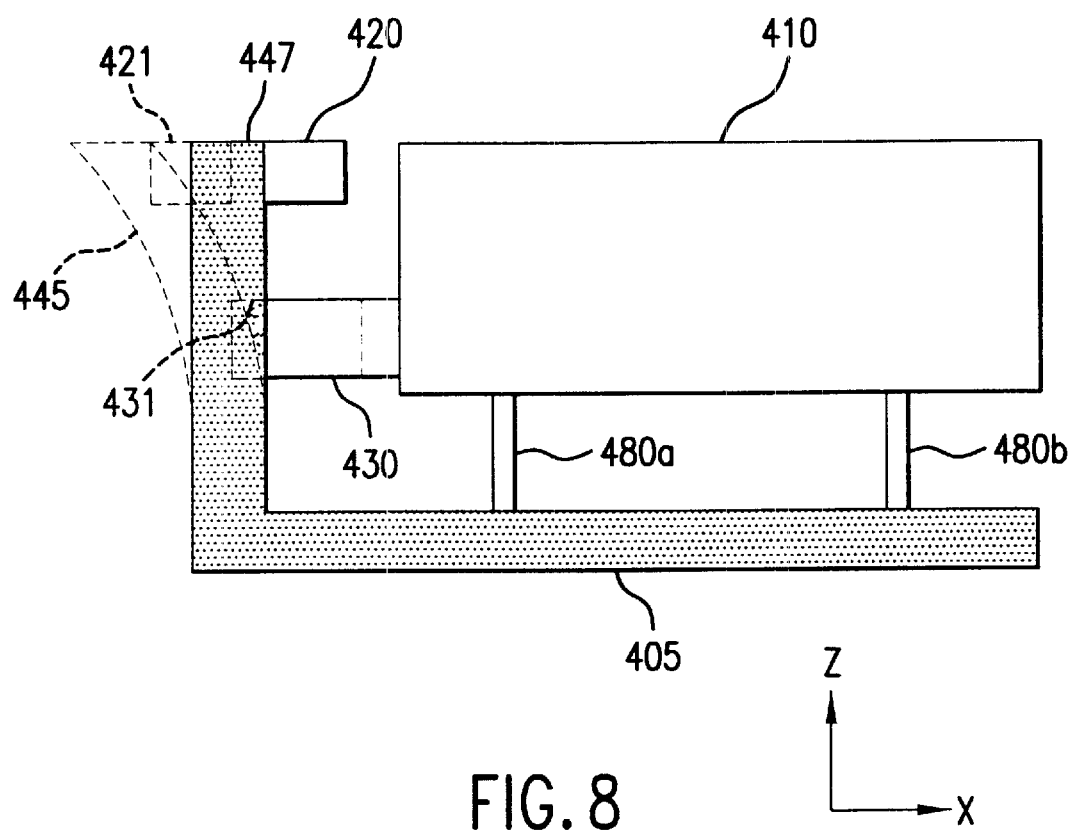
FIG. 8 illustrates a conventional actuator and sensor placement for an isolation system.

A key concept in this embodiment (as in the above embodiment) is to ensure that the forces applied by actuators to control the position of a body do not cause unwanted motion of the supposedly fixed sensor frame of reference, which is then falsely interpreted as motion of the body to be controlled. FIG. 8 illustrates the falsely interpreted motion in a lithography scanner. In this figure, the horizontal position of a body with respect to the ground is to be controlled by means of a sensor and actuator, both attached to a frame in contact with the ground. The body may be subject to external disturbance forces, necessitating a position control system. Using the position sensor input, a controller gives an appropriate command to the actuator, which exerts a force on the body so as to maintain the body's horizontal position, as measured by the sensor.

In this configuration actuator 430 and sensor 420 are both attached to the same vertical member 447 of the frame 405. The actuator 430 is used to apply reaction forces against body 410. Body 410 represents the base of a lithography system, described earlier, which is supported by air mounts 480 *a* and *b* in the z-axis. A result of actuator 430 applying reaction forces against body 410 is to cause the vertical member 447 to deflect to deflected position 447A. As vertical member 447 deflects, the location of sensor 420 relative to body 410 and to the frame 405 (or ground) changes. Sensor 420 is shifted to a new position represented by sensor 421. This results in an inaccurate measurement of the absolute position of body 410 relative to the frame 405.

This inaccurate measurement would have an adverse effect on a control system that utilizes measurements from sensor 420 in a feedback control system. This is especially important in a situation where the control system may have a goal of maintaining an absolute position relative to ground or some other reference. As such, it is desirable to eliminate the effect of the deformation of the vertical member 447 and the subsequent displacement of the sensor 420.

The actuator force on body 410 gives rise to an equal and opposite force on the frame to which the actuator is mounted, resulting in deformation of the frame. If the sensor is mounted on the same frame, this deformation causes the sensor body to move, so that the sensor output no longer reflects only the motion of the body. This difference between the intended measurement and the actual measurement is an error that by its nature is undetectable by the sensor but still represents a real degradation in the performance of the system. In an extreme case, one can imagine the body moving under the influence of disturbance forces, and the control system reacting to distort the frame to follow the body, rather than to control the body itself.

Figure 9:
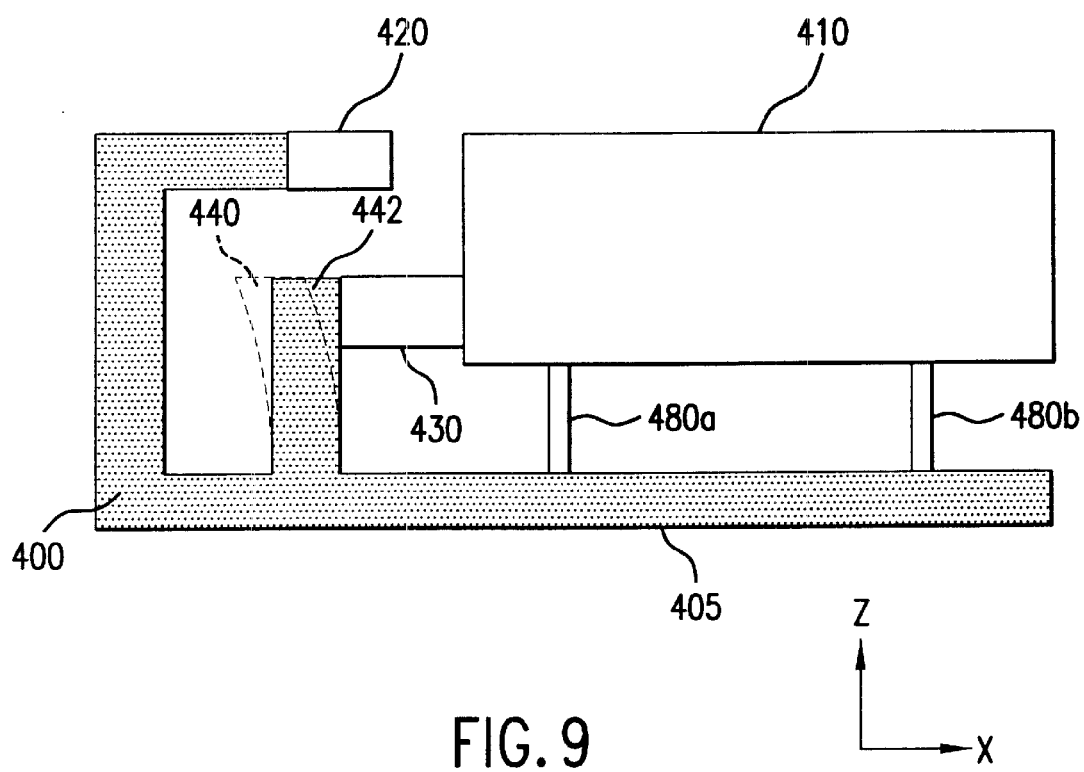
FIG. 9 illustrates an improved actuator and sensor placement for an isolation system.

To eliminate this problem, the sensor and actuator can be mounted on separate frames, as illustrated in FIG. 9. Here the actuator is mounted on one part of the structure, and the sensor is mounted on a separate part, a metrology frame. Since the reaction force from the actuator deforms its mounting structure but not the metrology frame, the sensor signal is not corrupted by frame deformation; instead, it measures the true motion of the body with respect to ground, as desired. Actuator 430 is attached to vertical member 442 and sensor 420 is attached to vertical member 400. As actuator 430 is commanded to react against body 410 vertical member 442 deflects to deflected vertical member 440. In this configuration, sensor 420 still provides an accurate measurement of the position of body 410 relative to the frame 405 (or ground) because vertical member 400 does not deflect.

Load Cell Sensor System for an Isolation System

Lithography control systems tend to become more complicated as the speed of fabrication systems increase. Current methods of utilizing acceleration or velocity sensors as a feedback sensor in an isolation system present difficulties due to the presence of flexibility in the structure supported by an isolation system or the ground itself. An effective method for dealing with this flexibility involves the use of a force measurement feedback sensor. See T. Tupper Hyde and Edward F. Crawley, "Active Vibration Isolation for Space Structures," M.I.T. SERC Report #4–96, 1996.

Figure 10:
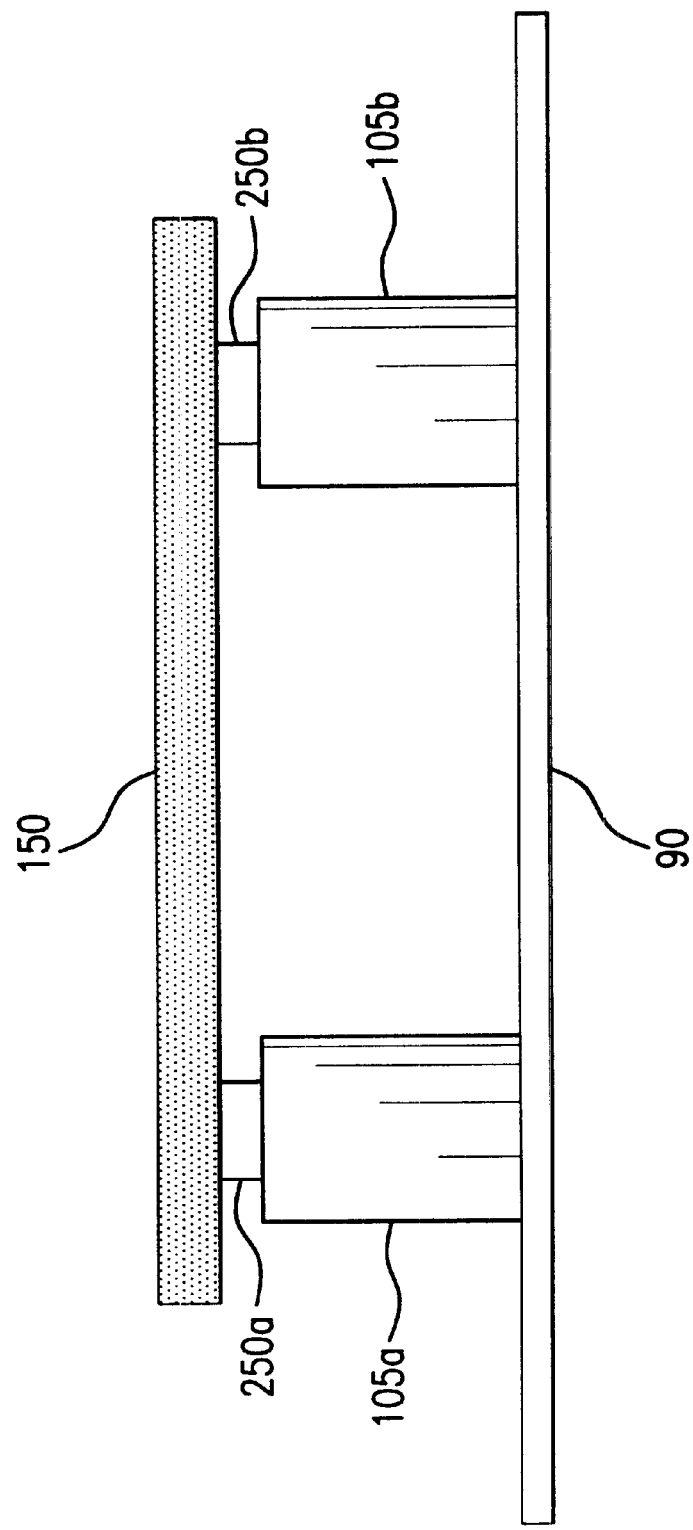
FIG. 10 illustrates an improved isolation system that utilizes a combination of load cell measurements.

In a preferred embodiment of the present invention, piezoelectric load cells 250a and b (approximately 6.35 mm diameter×0.5 mm) are located between air mount 105a and b and base 150 as shown in FIG. 10. The load cells preferably are packaged as described in U.S. Pat. No. 5,656,882 (hereby incorporated by reference herein). In this embodiment, electrical connection to the two major sides of the piezoceramic sensor could be achieved through insulated copper traces. Alternatively, a bare piece of piezoceramic material could be utilized as the load cell along with some means of electrical connection (e.g. 30 AWG copper wire) to the electrically conductive surfaces of the piezoceramic material. The load sensor are utilized to measure the reaction forces (load) applied between base 150 relative and the air mounts 105 a and b.

PZT load cell 250 a and b will produce 10's of volts in response to forces applied by the air mounts 105 a and b or in response to vibrations in the base 150 or ground structure 90 as transmitted through the air mounts 105 a and b. The sensors can easily measure forces or vibrations at a frequency in excess of approximately 100 kHz. In the FIG. 10 example the load cells 250 a and b are used in conjunction with a feedback control system as described, for example, by a system described in FIGS. 1 and 7. In FIG. 10, the load sensors 250 a and b produce an electrical charge that is proportional to the applied load or vibration. This charge is fed into an electronic charge amplifier circuit (e.g. signal conditioner) used to condition the signal by converting it in to a voltage proportional to the charge. The details of the design of the charge amplifier circuit can be found in a PCB Piezotronics Inc. technical support document entitled "Introduction to Signal Conditioning for ICP and Charge Piezoelectric Sensors" or similar instruction manual dealing with vibration sensor design and implementation. This signal is then sent to processor 42 as illustrated in FIG. 1.

Inertial Position Estimator

Achieving a high-quality exposure of photoresist in a photolithography tool requires that the wafer surface be maintained in the focal plane of the projection lens to a high degree of accuracy. This position accuracy must be maintained in the presence of disturbances from the surrounding environment (particularly the floor) and must accommodate normal motion of the reticle stage and wafer stage themselves. Interferometers are typically used to accurately measure the relative position of the projection lens and the base that supports the wafer stage, but such a metrology system entails considerable cost and complexity.

Acceptably small motion of the projection lens relative to the base can be achieved by maintaining the position of both with respect to a quasi-inertial frame of reference. Accelerometers can be used to measure inertial acceleration. However accelerometers cannot be used to determine position because it requires integrating the amplifier signal twice to achieve a measurement of position. Integrating an accelerometer results in amplification of the low frequency noise that is attributable to the signal conditioning electronics. When the noise is amplified it results in a measurement that is unsuitable for estimating position or for feedback control. Gap sensors, alternatively, provide very accurate low frequency position measurements. (assuming the average floor position to be a quasi-inertial reference), however they are sensitive to floor vibrations and have an equivalent noise floor associated with their specific signal conditioning electronics. As such, it is preferable to have a system that makes use of the best features of both sensor systems.

By properly combining the information from both the gap and accelerometer sensors in a specially designed filter, the total contribution of the noise from the sensors can be minimized to achieve an estimate of the inertial position more accurate than that obtained from either type of sensor independently. This position estimate may be sufficiently accurate to allow isolation and stabilization performance evaluation for tests in which an independently isolated interferometer-based metrology system is unavailable. This inertial position estimate could also be used for closed-loop feedback control, eliminating the need for the interferometer system altogether.

Figure 11:
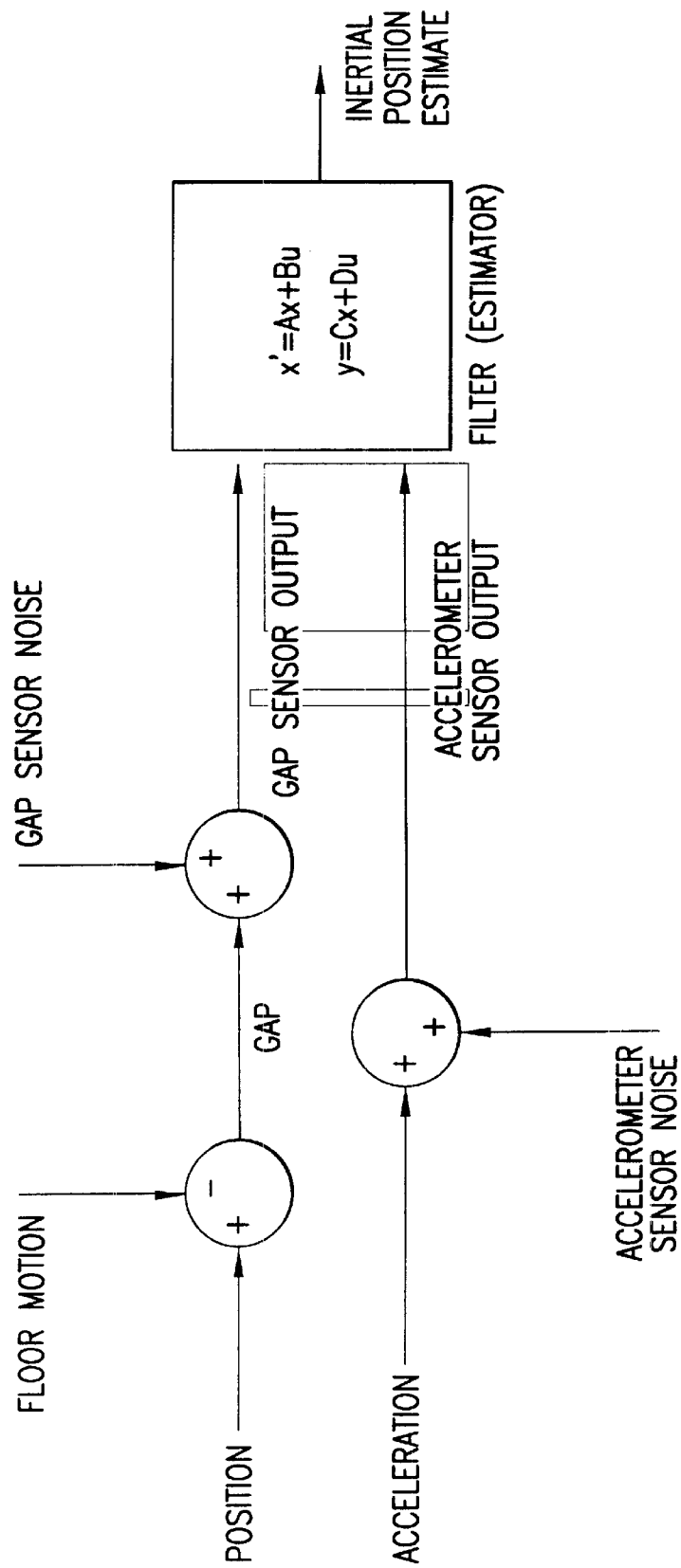
FIG. 11 provides a flow chart illustrating the combination of sensor signals used to provide an inertial position estimate.

Desirable properties of an inertial position estimator can be understood qualitatively by considering the contributions of the various signal and noise sources to the computed estimate. Referring to FIG. 11, it is clear that in the absence of floor motion, gap sensor noise, and accelerometer sensor noise, the true inertial position and true acceleration would appear as the inputs to the estimator in the form of the gap sensor and accelerometer outputs. The inertial position can be derived from these clean signals from the gap sensor output alone, the accelerometer output alone (after twice integrating), or some appropriate combination of the two. Mathematically, if we let the filter transfer functions from gap sensor output to position estimate and accelerometer output to position estimate be $k_g$ (s) and $k_a$ (s), respectively; when these two functions satisfy the relation $$k_g(s)+s^2 k_a(s)=1 \quad (1)$$

the inertial position is correctly computed from clean signals. The choice $$k_g(s)=1 \quad (2)$$
$$k_a(s)=0$$

corresponds to relying entirely on the gap sensor to calculate inertial position; the choice $$k_g(s) = 0 \quad (3)$$
$$k_a(s) = \frac{1}{s^2}$$

corresponds to relying entirely on the accelerometer inertial position, with two integrations.

Figure 12:
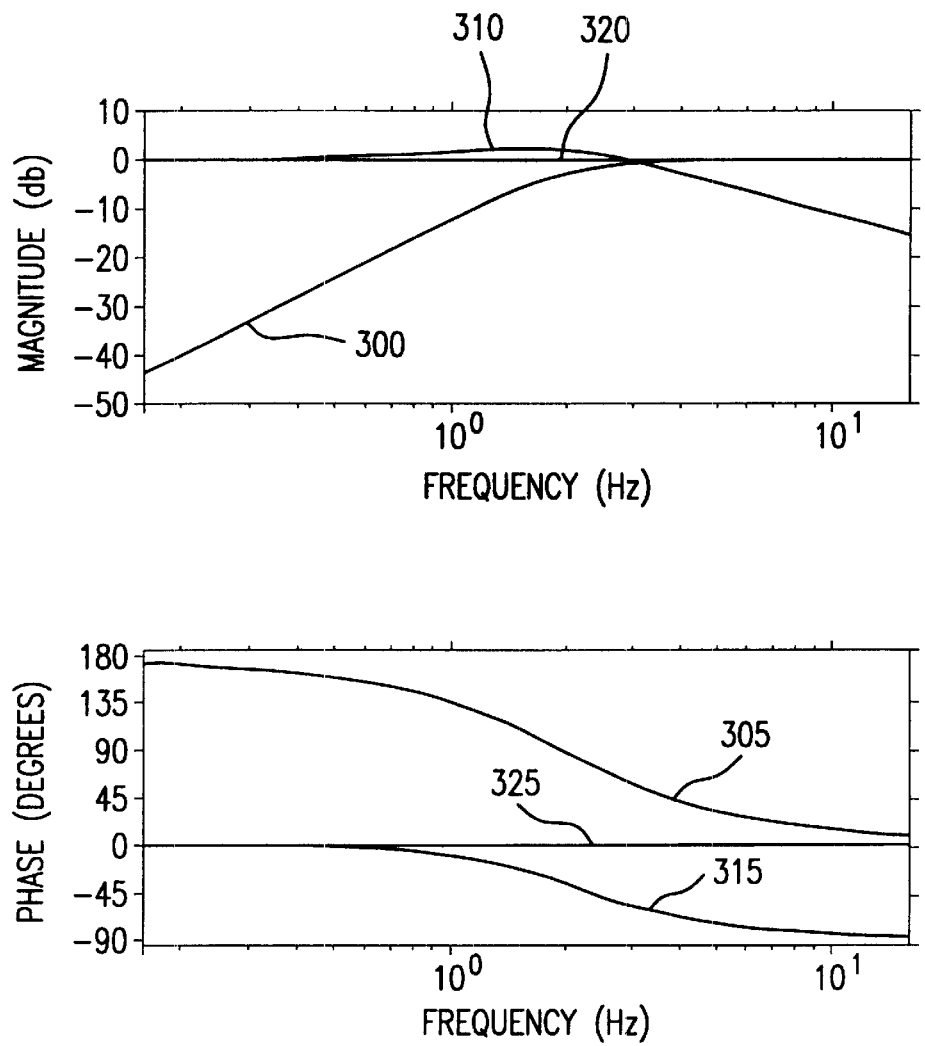
FIG. 12 illustrates the transfer function of the inertial position estimate based upon gap sensor and accelerometer information.

In practice, floor motion, gap sensor noise, and accelerometer sensor noise are all present; they too will be filtered through the estimator and constitute the error component of the inertial position estimate. For noise sources with assumed or measured statistical properties, the size of the inertial position estimate error will depend on the filter transfer functions chosen; the parameters of these functions can be chosen to minimize the inertial position estimate error, subject to the constraint imposed by the equality relation (EQN. 1) given above. FIG. 12 shows the optimum gain and phase of the transfer functions when the gap sensor and accelerometer noise sources are each assumed to be white noise, with intensity levels such that the accelerometer noise, interpreted as position error, is greater than the gap sensor noise below 2 Hz and smaller than the gap sensor noise above 2 Hz. Note that FIG. 12 illustrates the magnitude 310 and phase 315 of the gap sensor transfer function. Further, the magnitude 300 and phase 305 of the accelerometer transfer function is shown multiplied by $s^2$. When the transfer functions of the gap sensor and accelerometer are summed together they satisfy the equality relation as shown by the magnitude 320 and phase 325 of the inertial position estimate.

This particular optimum estimator for filtering the gap sensor and accelerometer sensor data can be obtained by solving the Kalman filter (see The Control Handbook) problem with the assumption that the true motion is expected to be large in comparison to the noise sources. If the true motion is smaller, approaching the magnitude of the noise contributions, the solution to the Kalman filter problem will deviate from the equality relation. This deviation means that, in the absence of noise, even true acceleration and position inputs will yield an inertial position estimate with some error;.the filter is still optimum, however, because increased attenuation of the noise sources results in a minimization of the total error in the inertial position estimate.

Other, non-optimal filters may be derived; as long as they satisfy the equality relation, they will at least not distort the true signal component, though they will allow more error contribution from the noise sources than the Kalman filter solution does. If, for example, a gap sensor channel response is desired which has a steeper roll-off than that provided by the Kalman filter, a $k_g$ (s) with the desired properties may be chosen, and the corresponding accelerometer filter $k_a$ (s) can then be computed from the equality relation.

Equivalents

While the invention has been particularly shown and described with reference to specific preferred embodiments, it should be understood by those skilled in the art that various changes in form and detail may be made therein without departing from the spirit and scope of the invention as defined by the appended claims. Possible variations include:

1) all three axes (x, y, z) are controlled using one controller. They are coupled.
2) all axes (x, y, z and rotations around x, y, z) are controlled using one controller. They are coupled.
3) performance of the system can be optimized for a variety of disturbance conditions (step, scan, expose of the lithography system).
4) the linear motor is a voice-coil motor.
5) the displacement sensor is a capacitive gap sensor.
6) other sensors contemplated include: accelerometers, velocity sensors, laser displacement sensors.
7) the linear motor is a magnetic actuator.
8) this invention could be applied to other manufacturing equipment (metrology and inspection, pick and place, optical component manufacturing, etc.).
9) the controller is a SISO or MIMO controller. The MIMO controller is based upon Linear Quadratic Guassian (LQG) techniques, or mu-synthesis, or H-infinity techniques.
10) the isolation system may just be one control system located on a lithography stage (there may be others, for example vibration reduction).
11) information may be collected from the system and used by the factory through Cymer On-line described in U.S. Patent Application Ser. No. 09/733,194.

What is claimed is:

1. A base stabilization system for controlling motion of a controlled structure said stabilization system comprising:

A) a ground structure,
B) a base structure on which equipment is mounted said base structure and said equipment comprising said controlled structure,
C) a least three air mounts supporting said base structure,
D) at least three vertical actuators each of which is attached to said ground structure and to said base structure for controlling vertical motion of said controlled structure,
E) a plurality of vertical position sensors one of which is co-located with each one of said at least three vertical actuators for monitoring vertical positions of said base structure relative to said ground structure,
F) a plurality of vertical accelerator sensors one of which is co-located with each one of said at least three and one of the position sensors for monitoring acceleration of said base structure,
G) a multi-input, multi-output feedback control system comprising a computer processor programmed with a feedback control algorithm for controlling each of said at least three vertical actuators based on feedback signals from each of said vertical position sensors and each of said vertical accelerator sensors said feedback.

2. The system as in claim 1 wherein the controlled structure comprises at least a portion of a lithography machine.

3. The system as in claim 1 wherein said at least three air mounts are three air mounts and said at least three vertical actuators are three vertical actuators.

4. A system as in claim 1 and further comprising:
   A) two first direction horizontal actuators for motion control of said controlled structure in a first horizontal direction,
   B) one second direction horizontal actuator for motion control in a second direction transverse to said first direction,
   C) three additional position sensors, one of which is co-located with each one of said two first direction horizontal actuators and said second direction horizontal actuator,
   D) three additional accelerator sensors, one of which is co-located with each one of said two first direction horizontal actuators and said second direction horizontal actuator,
wherein said feedback control algorithm is programmed to control said first direction horizontal actuators and said second direction horizontal actuator in order to provide three dimensional control for said controlled structure.

5. A system as in claim 1 wherein said feedback control algorithm incorporates a linear quadratic regulator solution.

6. A system as in claim 4 wherein said feedback control algorithm incorporates a linear quadratic regulator solution.

7. A system as in claim 1 wherein said at least vertical actuators comprise voice coil motors.

8. A system as in claim 4 wherein all of said actuators each comprise a voice coil motor.

9. A system as in claim 1 wherein at least one prior of said collocated sensors and actuators are located on a frame separate from each other.

10. A system as in claim 4 wherein at least one pair of said collocated actuators and sensors are located on frames separate from each other.

11. A system as in claim 4 wherein each pair of said collocated actuators and sensors are located on frames separate from each other.

12. A system as in claim 4 wherein at least one of said sensors is a piezoelectric load cell.

13. A system as in claim 1 and further comprising an inertial position estimator.

14. A system as in claim 13 wherein said inertial position estimator is programmed to determine displacement using both gap sensors and accelerometers.

* * * * *